(12) United States Patent
Smith et al.

(10) Patent No.: US 6,308,631 B1
(45) Date of Patent: Oct. 30, 2001

(54) MEMS VERTICAL TO HORIZONTAL MOTION TRANSLATION DEVICE

(75) Inventors: Gabriel L. Smith, Waldorf, MD (US); Lawrence Fan, Vienna, VA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 09/620,128

(22) Filed: Jul. 20, 2000

(51) Int. Cl.[7] .................................................. F42L 15/34
(52) U.S. Cl. ............................................................ 102/254
(58) Field of Search ....................... 102/254; 310/40 MM

(56) References Cited

U.S. PATENT DOCUMENTS

| | | |
|---|---|---|
| 5,375,033 | 12/1994 | MacDonald . |
| 5,489,812 | 2/1996 | Furuhata et al. . |
| 5,493,156 | 2/1996 | Okada . |
| 5,536,988 | 7/1996 | Zhang et al. . |
| 5,629,918 | 5/1997 | Ho et al. . |
| 5,644,177 | 7/1997 | Guckel et al. . |
| 5,705,767 * | 1/1998 | Robinson ............................. 102/231 |
| 5,808,384 * | 9/1998 | Tabat et al. ..................... 310/40 MM |
| 6,167,809 * | 1/2001 | Robinson et al. ................... 102/235 |
| 6,173,650 * | 1/2001 | Garvick et al. ................... 102/202.5 |
| 6,211,598 * | 4/2001 | Dhuler et al. ........................ 310/307 |

* cited by examiner

*Primary Examiner*—Charles T. Jordan
*Assistant Examiner*—Jordan Lofdahl
(74) *Attorney, Agent, or Firm*—Mark Homer

(57) ABSTRACT

A micromechanical device that takes a vertical force to a micro substrate that results into a vertical motion and translates that vertical motion into horizontal motion. A pit is etched onto a micro substrate where the walls of the pit meet the floor of the pit at less than a 90° angle. A vertical force is applied to a structure to push it along the angled wall of the pit and as the structure reaches the bottom of the pit the vertical motion is translated into horizontal motion. By attaching a spring or similar mechanism to the structure, one can store the horizontal momentum for later use by latching the structure in some way before the spring can pull the structure back into its original position.

20 Claims, 3 Drawing Sheets

MEMS VERTICAL TO HORIZONTAL MOTION TRANSLATION DEVICE

STATEMENT OF GOVERNMENT INTEREST

The invention described herein may be manufactured and used by or for the Government of the United States of America for governmental purposes without payment of any royalties thereon or therefor.

BACKGROUND OF THE INVENTION

1. Field of the Invention

The present invention is micromechanical device on the order of 100 µm to 10 mm for translating force normal to a plane into motion along said plane. Throughout the remainder of this application, the term vertical means approximately normal to a plane and the term horizontal means approximately parallel or approximately along the plane of a substrate of the device described herein. More particularly, the device receives a vertical force and translates the energy from that force for use in the horizontal plane. The device can easily be employed as part of a micro-actuator system.

2. Description Of The Related Art

Many products manufactured today require the use of micromechanical devices in order to meet size and weight requirements. Many of these micromechanical devices are used as actuators or trigger mechanisms that apply forces to a multitude of components in order for the products to function. These devices are extremely small, on the order of 100 µm to 10 mm, and are normally manufactured on a flat substrate or "chip." In order for these micromechanical devices to function as actuators, a force must be applied to the devices so they, in turn, can apply this force to the mechanism they are designed to actuate. Current devices use a myriad of forces to accomplish this task including electrostatic forces, magnetic forces, and gravitational forces.

Because of the sizes at issue, the devices normally operate in the horizontal plane along the substrate upon which they are manufactured. Therefore, these devices exert the required forces along the substrate in order to obtain the required result from the device.

However, due to the design of certain machinery and equipment, it is sometimes far more effective or efficient to apply the required forces to the chip vertically. But in order for vertical forces to be useful along the substrate, one must convert the vertical motion resulting from the vertical force into horizontal motion. One example of equipment wherein applying vertical forces to a horizontal microactuator would be more effective and efficient is munitions used by the military. Because of weight and energy restrictions in munitions, micromechanical devices have been incorporated to arm the munitions. However, the optimum design of these munitions places the substrate of the micromechanical device in a horizontal position. When the munitions are fired or launched, a large amount of vertical force occurs throughout the munitions. This vertical force cannot be used to engage the micromechanical device in current systems.

SUMMARY OF THE INVENTION

The invention consists of a micromechanical device for translating vertical force to horizontal movement, comprising a substrate having a surface, a recess formed within the surface, having a wide section with an opening formed coplaner to the surface, with at least one side wall extending at an angle of about 90° or less from the opening of the wide section, and at least one narrow section extending from the wide section through the side wall, and, at least one structural member comprising a mass proximate to the side wall, the mass wider than the narrow section of the recess and sufficiently narrow to at least partially enter the wide section of the recess, a positioning system attached to the mass and aligned proximate to the narrow section of the recess, means for exerting a horizontal force on the mass, approximately coplaner with the surface, attached to the positioning system, and, means for exerting a vertical force on the mass, approximately perpendicular to the surface, sufficient to force the mass along the side wall, thereby engaging the horizontal force means.

The invention also includes of a method for arming a warhead, comprising the steps of inserting means for igniting the warhead within the warhead, inserting a micromechanical device such as that translates vertical movement to horizontal movement within the warhead comprising a substrate having a surface, a recess formed within the surface, having a wide section with an opening formed coplaner to the surface, with at least one side wall extending at an angle of about 90° or less from the opening of the wide section, and at least one narrow section extending from the wide section through the first side wall, and, at least one structural member comprising a mass proximate to the side wall, the mass wider than the narrow section of the recess and sufficiently narrow to at least partially enter the wide section of the recess, a positioning system attached to the mass and aligned proximate to the narrow section of the recess, means for exerting a horizontal force on the mass, approximately coplaner with the surface, attached to the positioning system, sufficient to align the structural member to engage the ignition means, and, launching the warhead to provide a vertical force, approximately perpendicular to the surface, sufficient to move the mass along the side wall, thereby engaging the horizontal force means wherein alignment of the structural member results in ignition.

The invention still further consists of micro horizontal movement translated from a vertical force applied to the surface of a substrate produced from the process comprising the steps of forming a micro recess within the surface, having a wide section with an opening formed coplaner to the surface, with at least one side wall extending at an angle of about 90° or less from the opening of the wide section, and at least one narrow section extending from the wide section through the side wall, placing at least one structural member proximate to the micro recess comprising a mass proximate to the side wall, the mass wider than the narrow section of the recess and sufficiently narrow to at least partially enter the wide section of the recess, a positioning system attached to the mass and aligned proximate to the narrow section of the recess, and, means for exerting a horizontal force on the mass, approximately coplaner with the surface, attached to the positioning system, and, exerting a vertical force on the mass, approximately perpendicular to the surface, sufficient to force the mass along the side wall, thereby engaging the horizontal force means.

Accordingly, it is the object of this invention to provide a micromechanical device that translates a vertical force into horizontal movement.

It is a further object of this invention to produce a micromechanical device that can use the vertical force produced by a munition, missile, or warhead upon lift-off in order to arm said munition, missile, or warhead.

This invention accomplishes these objectives and other needs requiring translation of vertical force to horizontal movement on the micro scale.

BRIEF DESCRIPTION OF THE DRAWINGS

The accompanying drawings, which are incorporated in and constitute a part of the specification, illustrate embodiments of the invention, and, together with the description, serve to explain the principles of the invention.

DESCRIPTION OF THE PREFERRED EMBODIMENT

The invention, as embodied herein, comprises a micromechanical device on the order of 200 to 500 microns for translating vertical force into horizontal motion. The device is manufactured on a micro substrate placed in a horizontal plane. The device operates by placing a mass on the surface of the substrate and connecting the mass to a positioning system. The positioning system, in turn, is connected to a spring or other horizontal force means that is attached to the surface. The positioning system allows horizontal movement of the mass along the surface or vertical movement of the mass perpendicular to the surface. The spring or horizontal force means applies a horizontal force on the mass when the mass moves in the horizontal plane. A recess is formed within the surface comprising a wide section and a narrower section extending through an angled wall of the wide section. The mass is placed proximate to the angled wall of the wide section of the recess so the positioning system is proximate to the narrower section of the recess. When a vertical force is applied to the mass, the mass is forced along the angled wall of the recess so the angle of the wall forces the mass to move both vertically and horizontally. The narrower section of the recess ensures that the positioning system does not impede the movement of the mass into the wide section of the recess. Because the angled wall forces the mass to move partially in the horizontal plane, the spring or other horizontal force means is engaged and the resultant horizontal movement can be used for myriad purposes.

Figure 1:
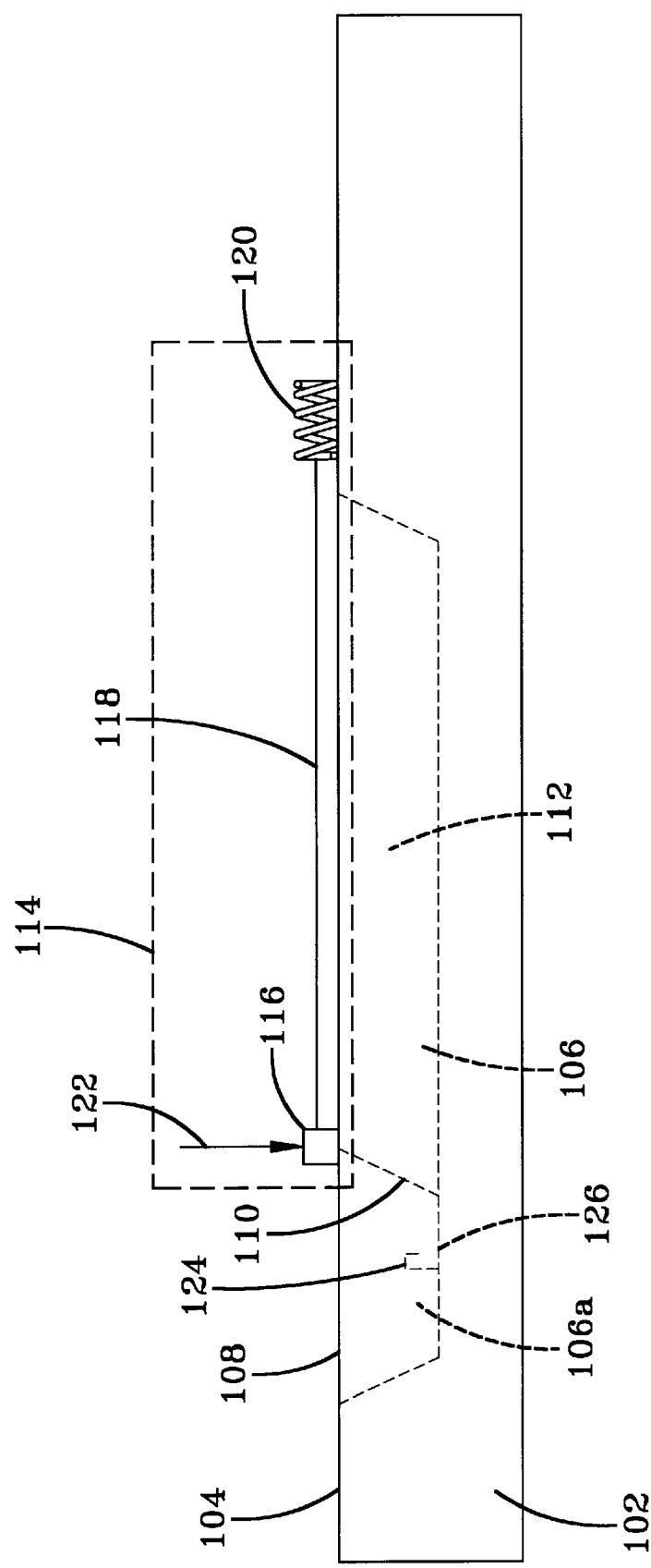
FIG. 1 is a cross sectional, side view of one embodiment of the invention comprising one structural member.

Referring to FIG. 1, one preferred embodiment of a micromechanical device for translating vertical force to horizontal movement comprises a substrate 102 having a surface 104. A recess 106 is formed within the surface 104 having a wide section 106a with an opening 108 formed coplaner to the surface 104. The wide section 106a has least one side wall 110, extending at an angle of about 90° or less from the opening 108. The recess 106 also has at least one narrow section 112 extending from the wide section 106a through the side wall 110. The device also comprises at least one structural member 114. The structural member 114 comprises a mass 116, proximate to the side wall 110, wider than the narrow section 112 and sufficiently narrow to at least partially enter the wide section 106a. The structural member 114 further comprises a positioning system 118 attached to the mass 116 and aligned proximate to the narrow section 112. The positioning system is connected to a means for exerting a horizontal force 120 on the mass 116, approximately coplaner with the surface 104. The structural member 114 also comprises a means for exerting a vertical force 122 on the mass 116, approximately perpendicular to the surface 104, sufficient to force the mass 116 along the side wall 110, thereby engaging the horizontal force means 120.

Figure 2:
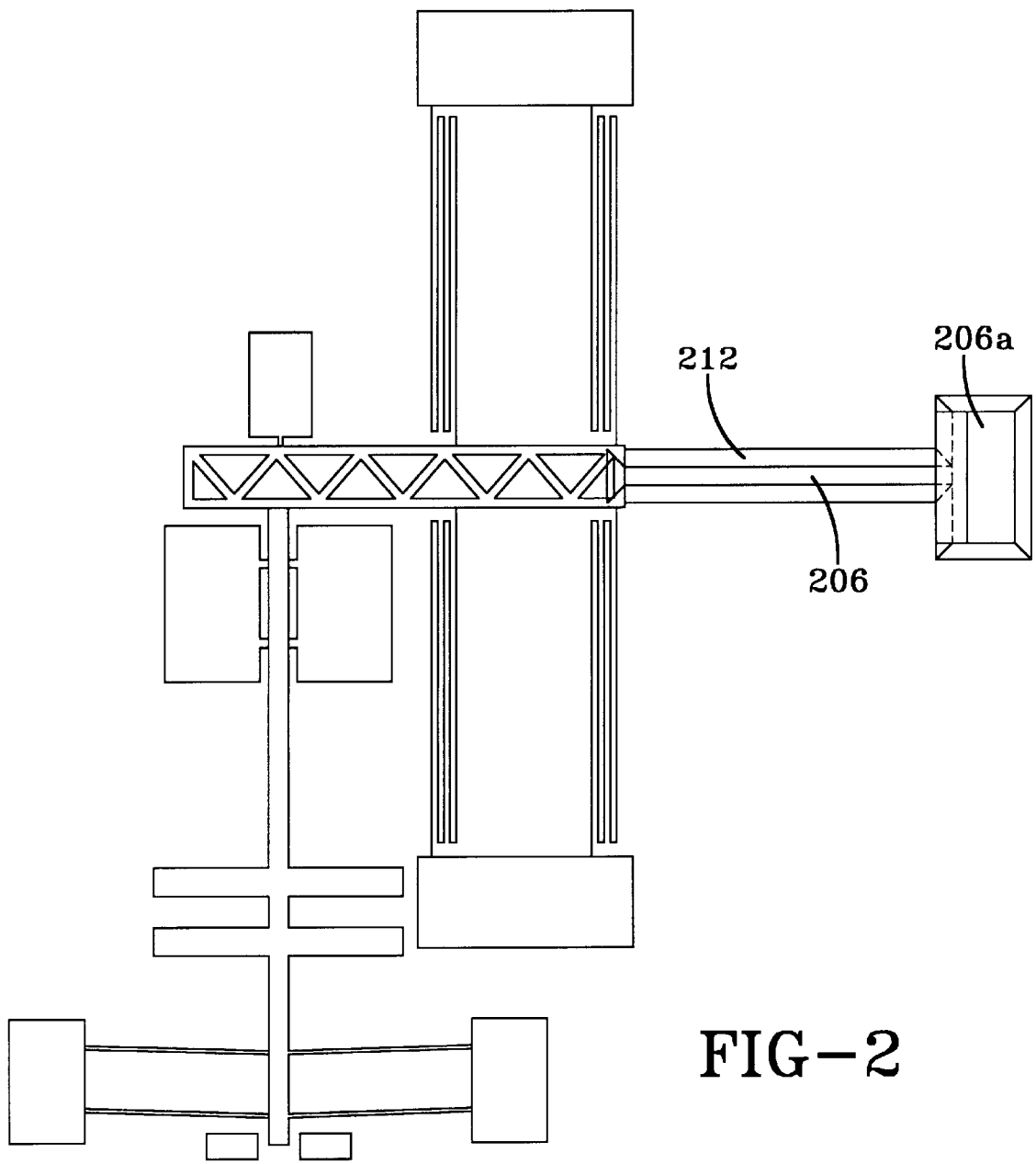
FIG. 2 is top view of the same embodiment of the invention set forth in FIG. 1.

The size of the substrate 102 is on the micro level. This normally comprises areas from about 100 μm to about 10 mm. The recess 106 will be formed within the surface 104 normally through etching, a standard process used in the manufacture of micro substrates. The wide section 106a comprises preferably from about 1 square millimeter or less or more preferably from about 0.16 square millimeters to about 0.25 square millimeters. The wide section 106a also comprises at least one side wall 110 which is at an angle of less than 90° from opening 108. In one preferred embodiment of the invention, the wide section 106a further comprises a floor 126 approximately parallel to the surface 104. The recess 106 also comprises at least one narrow section 112 which extends through the side wall 110 which is, again, portrayed by a dashed line in FIG. 1. FIG. 2 more clearly shows the narrow section 212 through a top view extending from the wide section 206a which is characterized by a dashed line in FIG.2. In some preferred embodiments of the invention, there are a plurality of side walls having a corresponding plurality of narrow sections extending through the side walls. For example, referring to FIG. 3, two narrow sections 312a and 312b extend from the wide section 306 through two side walls 310a and 310b.

Referring again to FIG. 1, the structural member 114 is shown by a dashed line above the narrow section 112. The mass 116 may comprise a proof mass or numerous other objects. In one preferred embodiment of the invention, the mass 116 comprises a shape sufficiently narrow to at least partially contact the floor 126 of the wide section 106a. The positioning system 118 ensures that the mass 116 maintains its position prior to engaging the device. The positioning system 118 preferably comprises a rigid structure such as a cantilever beam. In one preferred embodiment of the invention, as set forth in FIG. 3, the mass 316a and 316b and the positioning system 314a and 314b comprise a unitary T-shaped form. Referring again to FIG. 1, the horizontal force means 120 preferably attaches to the positioning system 118 and fixes to the surface 104 to exert a horizontal force upon the mass 116 when the mass 116 moves horizontally. The horizontal force means 120 preferably comprises a spring or other elastic type of system that when pulled exerts a force opposite to the pull. In one preferred embodiment of the invention, the horizontal force means 120 imparts a force approximately aligned with the narrow section 112 and away from the wide section 106a. Therefore, when a vertical force means, portrayed by arrow 122, approximately perpendicular to the surface 104, is applied to the mass 116, the vertical force means 122 forces the mass 116 along the side wall 110, and the horizontal force means 120 stretches; when sufficient stretching occurs or the vertical force means 122 stops, the horizontal force means 120 moves the structural member 114 horizontally. The vertical force means 122 may be provided in any manner but preferably comprises the force resulting from launching a warhead. In some preferred embodiments of the invention, a plurality of structural members can be employed that may be positioned corresponding to the plurality of side walls and narrow sections noted above.

Figure 3:
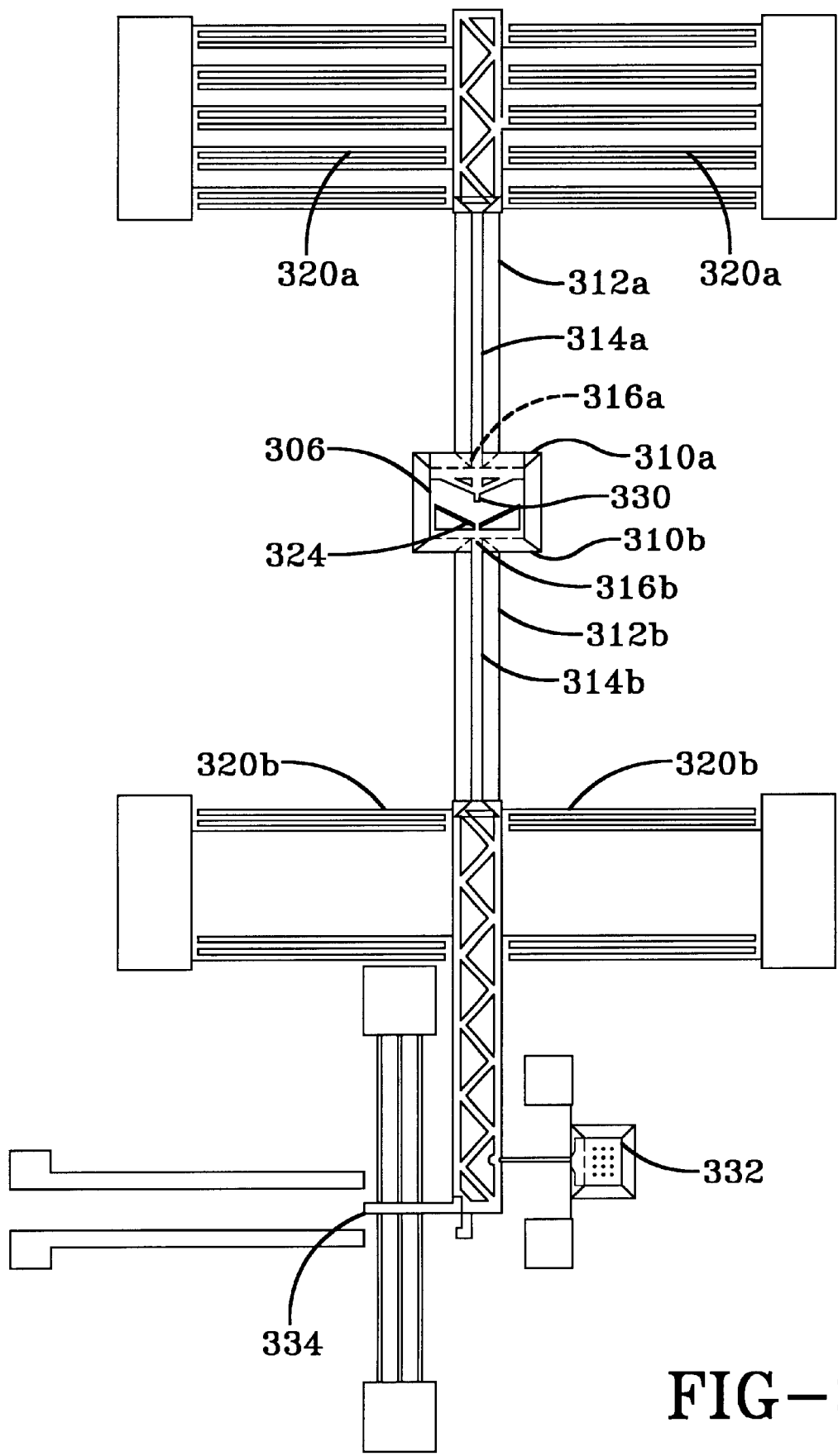
FIG. 3 is a top view of an alternative embodiment of the invention comprising two structural members and two locks.

Another embodiment of the invention further comprises means for latching 124 the mass 116 within the recess 106 to change the horizontal movement of the structural member 114 produced through the horizontal force means 120. The latching means 124 may also reduce the speed or amount of the horizontal movement. The latching means 124 may hold the structural member to delay the horizontal movement produced by the horizontal force means 120. The latching means 124 may comprise simple hook and release mechanisms or interlocking shaped mechanisms, however, a more preferred embodiment of the latching means 124 is set forth in FIG. 3. In FIG. 3 the latching means 324 comprises a second side wall 310*b*, opposite the side wall 310*a*, having a corresponding narrow section 312*b* and a corresponding structural member 314*b*. In this embodiment the horizontal force means 320*b* of the second side wall structural member 314*b* provides less force than the horizontal force means 320*a* of the structural member 314*a*. The latching means 324 also comprises a means for attaching the mass of the second side wall structural member 314*b* to the structural member 314*a* upon contact of the two corresponding masses, 316*a* and 316*b*, characterized by the interlocking mechanism 330. In this embodiment, the horizontal force means 320*b* provides more force in opposition to horizontal force means 320*a*, thereby causing greater horizontal movement in the direction of the horizontal force means 320*a*. A more complex embodiment of the invention may comprise a plurality of side walls having a corresponding plurality of narrow sections and a corresponding plurality of structural members noted above wherein the horizontal force means of the plurality of structural members provide varying amounts of force, and, means for attaching the masses of the plurality of structural members to the mass of the structural member upon contact of the masses. This embodiment of the invention would allow one to provide the horizontal movement in numerous directions and amounts.

Referring to FIG. 3, this preferred embodiment of the invention also comprises a first lock 332 capable of holding the structural members 314*a* and 314*b* substantially immobile. In the embodiment of the invention depicted, the first lock 332 holds the structural member 314*b* substantially immobile. Under vertical loading, the structural member 314*a* attaches to structural member 314*b* through the latching means 330, the first lock 332, also vertically actuated, releases structural member 314*b*. Until release of the first lock 332, the horizontal force means 320*a* and 320*b* may not act upon the device. In one preferred embodiment of the invention the first lock 332 comprises a hook mechanism releasable through the vertical force means. . However, the first lock 332 may comprise any means capable of holding the structural members 314*a* and 314*b* substantially immobile until release. The embodiment of the invention shown in FIG. 3 also comprises a second lock 334, independent of the first lock 332, that, when engaged, allows the two structural members 314*a* and 314*b* to move a predetermined distance. This second lock 334 allows some horizontal movement through the horizontal force means 320*a* and 320*b*, but does not allow all of the horizontal force stored in said means to be released. The second lock 334 would be released through a different mechanism than the first lock 332. Upon release of the second lock 334, the remaining horizontal force stored within the horizontal force means 320*a* and 320*b* would result in further horizontal movement. In one preferred embodiment of the invention the second lock 334 comprises a thermal actuator capable of releasing the second lock 334. This type of double locking scheme can be used for many purposes including part of a method for arming a warhead which is described below.

Although there are many applications for the micromechanical device described above, one preferred use is to assist in arming a warhead. The device set forth in FIG. 1 may be used in a method for arming a warhead. The first step in said method comprises inserting means for igniting the warhead into the warhead. Any standard method of igniting the warhead may be used. The second step in said method comprises inserting a micromechanical device, such as that shown in FIG. 1, that translates vertical force to horizontal movement within the warhead. The device comprises a substrate 102 having a surface 104, a recess 106 formed within the surface. The recess 106 has a wide section 106*a* with an opening 108 coplaner to the surface 104. The recess also has at least one side wall 110 extending at an angle of about 90° or less from the opening 108 and at least one narrow section 112 extending from the wide section 106*a* through the first side wall 110. The device also contains at least one structural member 114. The structural member comprises a mass 116 proximate to the side wall 110, the mass 116 wider than the narrow section 112, and sufficiently narrow to at least partially enter the wide section 106*a*. The structural member 114 also contains a positioning system 118 attached to the mass 116 and aligned proximate to the narrow section 112. The structural member 114 also comprises means for exerting a horizontal force 120 on the mass 116, approximately coplaner with the surface 104, attached to the positioning system 118. The horizontal force means 120 must be sufficient to align the structural member 114 to engage the igniting means. The final step of said method comprises launching the warhead to provide a vertical force 122, approximately perpendicular to the surface 104, sufficient to move the mass 116 along the side wall 110. Movement of the mass 116 engages the horizontal force means 120 wherein alignment of the structural member 114 results in ignition. This method for arming a warhead may also use the double locking scheme described above. The steps for including this locking scheme are shown by the locking mechanisms illustrated in FIG. 3. The first step comprises applying a vertical force, releasing the first lock 332 that holds the structural members 314*a* and 314*b* substantially immobile; simultaneously, the vertical force is converted to horizontal force and stored in the horizontal force means 320*a* and 320*b*. The second lock 334, when engaged, allows the structural members 314*a* and 314*b* to move a predetermined distance. In a preferred embodiment of the method, this would be accomplished by launching the warhead to provide a vertical force that would release the first lock 332 and store horizontal force in the horizontal force means 320*a* and 320*b*. This results in the structural members 314*a* and 314*b* moving a predetermined distance to prime the warhead. The final step comprises releasing the second lock 334 allowing structural members 314*a* and 314*b* to move to an armed position. This results in arming the warhead for ignition The embodiment of the micromechanical device set forth in FIG. 1 may also be used as part of a process for translating a vertical force 122 applied to the surface 104 of a substrate 102 to micro horizontal movement. The first step of this process comprises forming a recess 106 within the surface 104, having a wide section 106*a* with an opening 108 formed coplaner to the surface 104. The wide section 106*a* has at least one side wall 110 extending at an angle of about 90° or less from the opening 108 and at least one narrow section 112 extending from the wide section 106*a* through the side wall 110. The second step of the process comprises placing at least one structural member 114 proximate to the recess 106. The structural member 114 comprises a mass 116 proximate to the side wall 110. The mass 116 is wider than the narrow section 112 and sufficiently narrow to at least partially enter the wide section 106*a*. The structural member 114 also comprises a positioning system 118 attached to the mass 116 and aligned proximate to the narrow section 112. The structural member must also comprise means for exerting a horizontal force 120 on the mass 116, approximately coplaner with the surface 104, attached to the positioning system 118. The final step of the process comprises exerting a vertical force 122 on the mass 116, approximately perpendicular to the surface 104, sufficient to force the mass 116 along the side wall 110. The horizontal movement of the mass 116 engages the horizontal force means 120 to create horizontal movement in the opposite direction to the movement of the mass 116.

What is described are specific examples of many possible variations on the same invention and are not intended in a limiting sense. The claimed invention can be practiced using other variations not specifically described above.

What is claimed is:

1. A micromechanical device for translating vertical force to horizontal movement, comprising:
   a substrate having a surface;
   a recess formed within the surface, having a wide section with an opening formed coplaner to the surface, with at least one side wall extending at an angle of about 90° or less from the opening of the wide section, and at least one narrow section extending from the wide section through the side wall; and,
   at least one structural member comprising:
      a mass proximate to the side wall, the mass wider than the narrow section of the recess and sufficiently narrow to at least partially enter the wide section of the recess;
      a positioning system attached to the mass and aligned proximate to the narrow section of the recess;
      means for exerting a horizontal force on the mass, approximately coplaner with the surface, attached to the positioning system; and,
      means for exerting a vertical force on the mass, approximately perpendicular to the surface, sufficient to force the mass along the side wall, thereby engaging the horizontal force means.

2. The micromechanical device of claim 1, wherein the horizontal force means comprises a spring.

3. The micromechanical device of claim 1, wherein the horizontal force means imparts a force in a direction approximately aligned with the narrow section of the recess and away from the wide section of the recess.

4. The micromechanical device of claim 1, wherein the positioning system comprises a cantilever beam.

5. The micromechanical device of claim 1, wherein the wide section of the recess comprises an area from about 1 square millimeter or less.

6. The micromechanical device of claim 5, wherein the wide section of the recess comprises an area of from about 0.16 square millimeters to about 0.25 square millimeters.

7. The micromechanical device of claim 1, wherein the wide section of the recess further comprises a floor approximately parallel to the surface.

8. The micromechanical device of claim 7, wherein the mass comprises a shape sufficiently narrow to at least partially contact the floor of the wide section of the recess.

9. The micromechanical device of claim 8, further comprising means for latching the mass within the recess to alter the horizontal force produced upon the mass through the horizontal force means.

10. The micromechanical device of claim 9, wherein the latching means comprises:
    a second side wall, opposite the side wall, having a corresponding narrow section and a corresponding structural member wherein the horizontal force means of the second side wall structural member provides less force than the horizontal force means of the structural member; and,
    means for attaching the mass of the second side wall structural member to the mass of the structural member upon contact of the two masses.

11. The micromechanical device of claim 1, further comprising:
    a plurality of side walls having a corresponding plurality of narrow sections and a corresponding plurality of structural members wherein the horizontal force means of the plurality of structural members provide varying amounts of force; and,
    means for attaching the masses of the plurality of structural members to the mass of the structural member upon contact of the masses.

12. The micromechanical device of claim 10, further comprising:
    at least a first lock capable of holding the two structural members substantially immobile.

13. The micromechanical device of claim 12, wherein the first lock comprises:
    a hook mechanism releasable through the vertical force means.

14. The micromechanical device of claim 13, further comprising:
    at least a second lock, independent of the first lock, that, when engaged, allows the two structural members to move a predetermined distance.

15. The micromechanical device of claim 14, wherein the second lock further comprises a thermal actuator capable of releasing the second lock.

16. The micromechanical device of claim 15, wherein the vertical force means of both structural members comprises a force from launching a warhead.

17. The micromechanical device of claim 16, wherein the positioning system and mass of both structural members comprises unitary T-shaped forms.

18. A method for arming a warhead, comprising the steps of:
    inserting means for igniting the warhead within the warhead;
    inserting a micromechanical device that translates vertical movement to horizontal movement within the warhead comprising a substrate having a surface, a recess formed within the surface, having a wide section with an opening formed coplaner to the surface, with at least one side wall extending at an angle of about 90° or less from the opening of the wide section, and at least one narrow section extending from the wide section through the first side wall, and, at least one structural member comprising a mass proximate to the side wall, the mass wider than the narrow section of the recess and sufficiently narrow to at least partially enter the wide section of the recess, a positioning system attached to the mass and aligned proximate to the narrow section of the recess, means for exerting a horizontal force on the mass, approximately coplaner with the surface, attached to the positioning system, sufficient to align the positioning system to engage the ignition means; and,
    launching the warhead wherein a vertical force is provided, approximately perpendicular to the surface, sufficient to move the mass along the side wall, thereby engaging the horizontal force means wherein alignment of the positioning system results in ignition.

19. The method for arming a warhead of claim 18, further comprising the steps of:
    storing the horizontal force through a first lock that holds the structural member substantially immobile and a second lock that, when engaged, allows the structural member to move a predetermined distance;

releasing the first lock to align the structural member wherein priming of the warhead occurs; and, releasing the second lock to align the structural member wherein ignition occurs.

20. Micro horizontal movement translated from a vertical force applied to the surface of a substrate produced from the process comprising the steps of:

forming a recess within the surface, having a wide section with an opening formed coplaner to the surface, with at least one side wall extending at an angle of about 90° or less from the opening of the wide section, and at least one narrow section extending from the wide section through the side wall;

placing at least one structural member proximate to the recess comprising a mass proximate to the side wall, the mass wider than the narrow section of the recess and sufficiently narrow to at least partially enter the wide section of the recess, a positioning system attached to the mass and aligned proximate to the narrow section of the recess, and, means for exerting a horizontal force on the mass, approximately coplaner with the surface, attached to the positioning system; and, exerting a vertical force on the mass, approximately perpendicular to the surface, sufficient to force the mass along the side wall, thereby engaging the horizontal force means.

* * * * *